United States Patent [19]

Beard

[11] Patent Number: 4,862,168
[45] Date of Patent: Aug. 29, 1989

[54] AUDIO DIGITAL/ANALOG ENCODING AND DECODING

[76] Inventor: Terry D. Beard, 1407 N. View Dr., Westlake Village, Calif. 91362

[21] Appl. No.: 27,747

[22] Filed: Mar. 19, 1987

[51] Int. Cl.⁴ .............................................. H03M 1/00
[52] U.S. Cl. .................................... 341/140; 341/110; 341/118
[58] Field of Search ................. 340/347 AD, 347 CC, 340/347 DA, 347 M; 381/29-31; 341/110, 118, 140, 144, 155

[56] References Cited

U.S. PATENT DOCUMENTS

| | | | |
|---|---|---|---|
| 3,973,199 | 8/1976 | Widmer | 325/38 B |
| 4,130,729 | 12/1978 | Gagnon | 179/1 SA |
| 4,133,976 | 1/1979 | Atal et al. | 179/1 P |
| 4,385,393 | 5/1983 | Chaure et al. | 375/30 |
| 4,430,670 | 2/1984 | Netravali | 358/135 |
| 4,700,362 | 10/1987 | Todd et al. | 375/30 |
| 4,746,902 | 5/1988 | Tol et al. | 340/347 CC |

OTHER PUBLICATIONS

The Engineering Staff of Analog Devices, Inc., "Analog-Digital Conversion Notes"; 1980; p. 64.
Precision Monolithics, Inc. "Linear and Conversion Products 1986/1987 Data Book".

*Primary Examiner*—William M. Shoop, Jr.
*Assistant Examiner*—Marc S. Hoff
*Attorney, Agent, or Firm*—Koppel & Jacobs

[57] ABSTRACT

Apparatus and an associated method are described for encoding an analog signal to a digital representation thereof and then decoding the same to reconstruct the original analog signal with reduced quantization noise and error. The analog signal is first adaptively pre-emphasized. A series of samples of the pre-emphasized signal are then obtained and encoded to create a series of digital representations which have a lower order resolution than the samples. The difference between each sample and its corresponding lower resolution digital representation is obtained and combined with the next sample. Decoding of the combined signals takes place in a complementary manner to create an approximate analog output signal, which is then de-emphasized in a manner complementary to the pre-emphasis to produce an analog output signal closely approximating the original analog signal. In a fully digital implementation the samples are converted to a digital format with a higher order resolution; the digital representations are obtained from the digitized samples, and the difference measurements are combined with the samples in their digital format. In a hybrid digital/analog implementation the difference is combined with the analog signal prior to sampling.

24 Claims, 8 Drawing Sheets

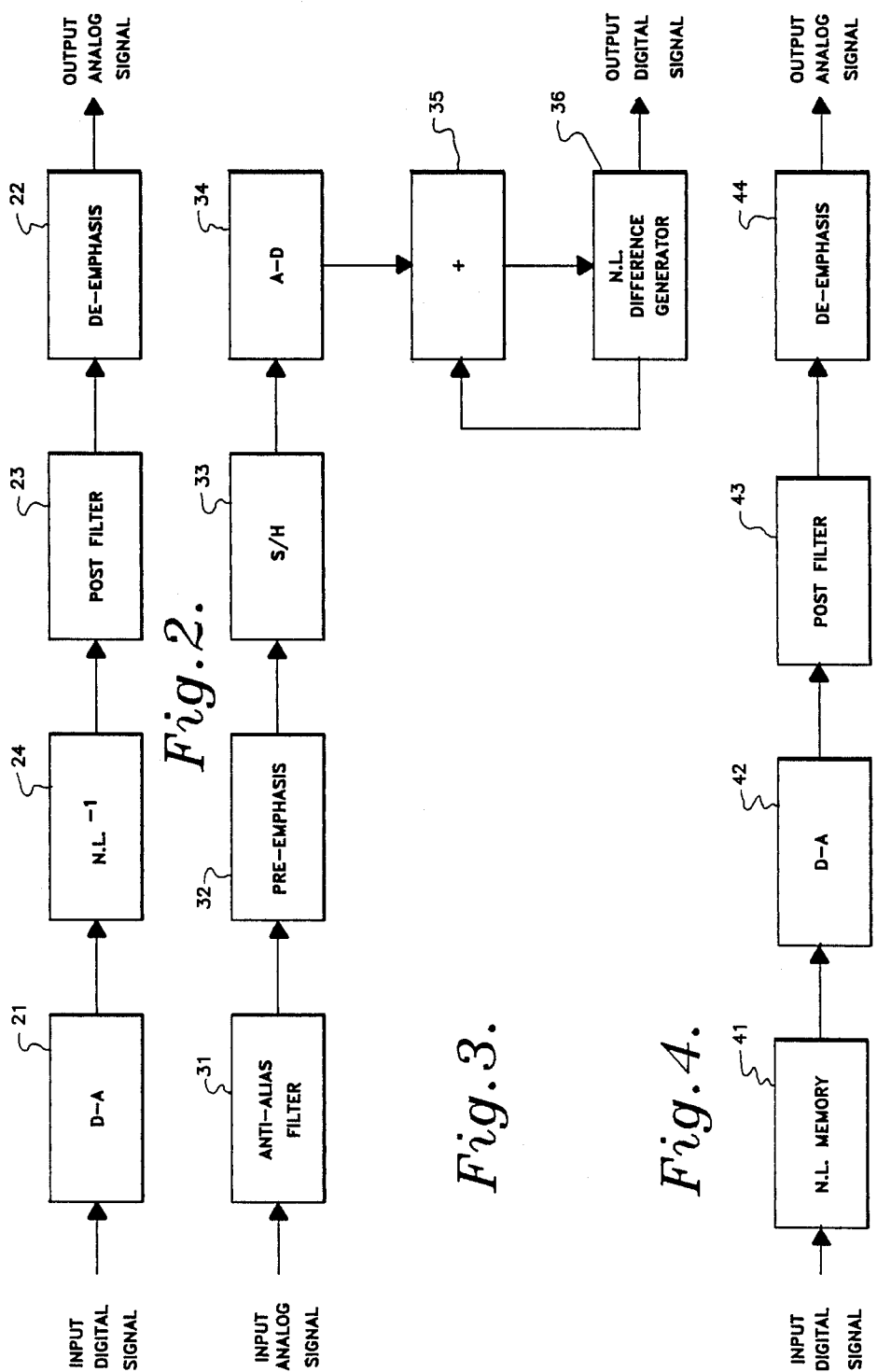

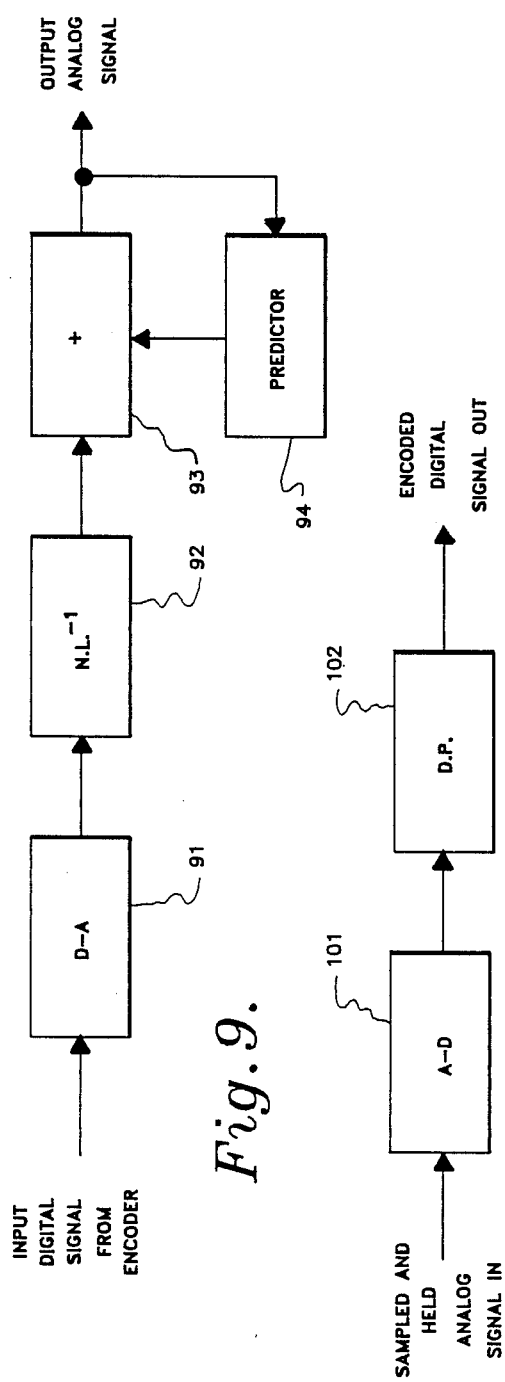
Fig. 9.
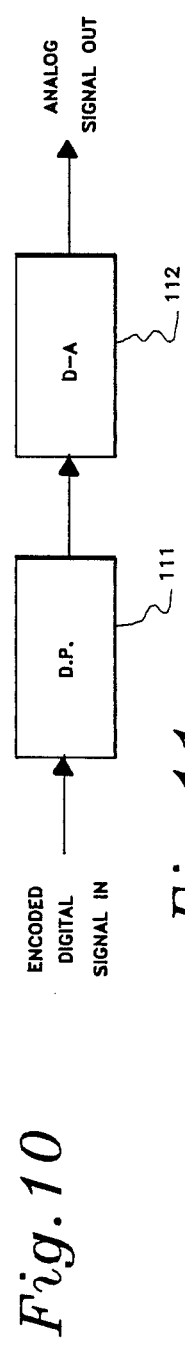
Fig. 10.
Fig. 11.

AUDIO DIGITAL/ANALOG ENCODING AND DECODING

BACKGROUND OF THE INVENTION

The present invention relates to a method and associated apparatus for encoding an analog signal into a digital form and for decoding the digital signal back into an analog form, wherein the encoding and decoding are performed in such a way as to maximize the useful dynamic range of the signal when used for encoding and decoding an audio signal.

Digital encoding of analog signals is usually accomplished by what is called a "linear" conversion, in which a simple direct binary value equal to the analog value to be encoded is generated. For example, an 8 bit digital system would encode all input analog signal values into one of 256 values linearly related to the input analog value. The conversion of the input analog signal into its binary representations takes place at a rate equal to at least twice the rate of the highest frequency component to be encoded within the analog signal. Because of the finite and limited number of representations possible using a binary number, the input signal is "quantized" and the representation at each sample may not accurately correspond to the associated analog value. For instance, if the encoding system is an 8 bit system, there are only 256 values possible, i.e. 0 through 255; or, more specifically in binary representation, 00000000 through 11111111. If the input analog value sampled were 128.438, for example, it would be represented by the nearest binary value, e.g. 1000000 or 128. The difference of 0.438 is an error often referred to as the "quantization error" or "quantization noise". When the analog signal being converted is an audio signal, this error is heard as noise when the signal is decoded back into its analog form. When the analog signal is large, the error represents only a small fraction of the overall signal value. When the signal is small, however, the error becomes much more significant. In fact, signals smaller than the quantization size are lost entirely.

One solution to this problem has been the use of non-linear digital encoders/decoders such as those commercially sold by Precision Monolithics, Inc. under the trademark COMDAC. The principle of operation of the COMDAC encoders/decoders is to make the step size dependent on the signal amplitude. As a result, for small signals the quantization noise is smaller and, therefore, less objectionable. At the same time, the quantization noise for large signals is correspondingly larger, and is adequately "masked" in the case of audio signals by the large signal itself. While the performance of the COMDAC device is acceptable for some uses, the general approach is inadequate for high fidelity audio use.

SUMMARY OF THE INVENTION

Accordingly, it is an object of the present invention to provide a method and associated apparatus for digital/analog encoding and decoding which exceeds the dynamic range of COMDAC devices while, at the same time, minimizes the effects of quantization noise.

It is another object of the present invention to provide a method and apparatus for digital/analog encoding and decoding which, while providing improved performance, does so in an efficient and economic manner.

It is yet a further object of the present invention to provide a method and apparatus for digital/analog encoding and decoding which is particularly adapted to audio signal encoding and decoding and will reduce noise to a level acceptable to persons having stringent requirements.

The foregoing objects have been realized by encoding/decoding apparatus performing the method of the present invention which comprises the steps of pre-emphasizing the analog signal to accentuate its high frequency components; successively sampling the pre-emphasized signal; encoding the samples non-linearly to create a series of digital representations of the samples having a lower order resolution than the sample resolution; obtaining the differences between the samples and their corresponding lower resolution digital representations; and combining each sample prior to encoding with the difference measurement for the previous sample. The encoded signal is then decoded in a non-linear complementary manner and converted to analog format to create an approximate analog output signal. This is followed by a deemphasis step which is complementary to the pre-emphasis to produce an analog output signal closely approximating the original analog input signal.

Both fully digital and hybrid analog/digital implementations of the present invention are possible and are disclosed with possible variations. In the fully digital embodiment the samples are converted to a digital format having a higher resolution than the series of digital representations. The digital representations are obtained from the digitally formatted samples, and the difference measurements are combined with the samples in their digital format. In the hybrid embodiment the difference measurement is combined with the pre-emphasized analog signal prior to sampling, and the samples are obtained from the combined analog signal and difference measurements.

DESCRIPTION OF THE DRAWINGS

FIG. 2 is a block diagram of a hybrid decoder according to the present invention.

FIG. 3 is a block diagram of a full digital non-linear encoder according to the present invention.

FIG. 4 is a block diagram of a full digital non-linear decoder according to the present invention.

FIG. 9 is a block diagram of a hybrid decoder according to the present invention incorporating a predictor therein.

FIG. 10 is a block diagram of a digital implementation of a predictor hybrid decoder according to the present invention.

FIG. 11 is a block diagram of a digital implementation of a predictor hybrid according to the present invention.

DESCRIPTION OF THE PREFERRED EMBODIMENT

The present invention accomplishes its objectives by using a non-linear encoding method with an error carryback technique and high frequency pre-emphasis of the analog signal before encoding. The analog signal to be encoded digitally is first pre-emphasized; that is, the high frequencies are selectively accentuated. The signal is then encoded into digital form in a non-linear analog to digital (A-D) encoder. The non-linearity may be provided by either analog or digital means. The difference between the analog equivalent of the resultant non-linear digital representation and the input analog signal is measured and added to the next sampled analog value to be encoded. For decoding, the digital representation is applied to a non-linear decoder which is complementary to the non-linear encoder used in the encoding processes. Again, this non-linear characteristic may be accomplished either digitally or by analog means. Finally, the signal is passed through a de-emphasis circuit which is complementary to the pre-emphasis circuit used in the encoding process.

Two functionally equivalent forms of the present invention are described hereinafter. They differ only in the method whereby the non-linear digital encoding is achieved. One is fully digital and one is a hybrid digital/analog method.

Figure 1:
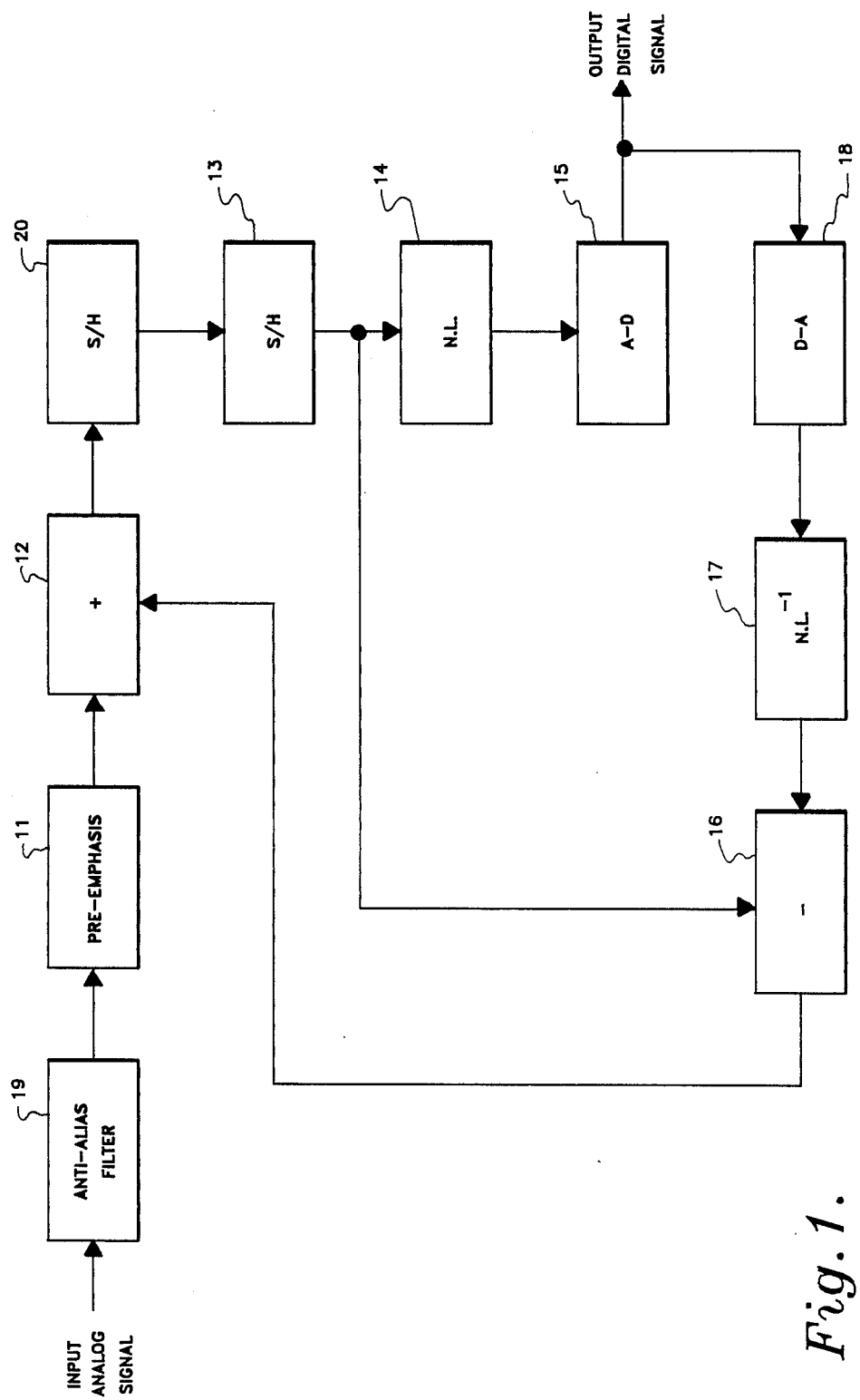
FIG. 1 is a block-diagram of a hybrid encoder according to the present invention.

The hybrid encoder is shown in FIG. 1. The input analog signal is applied to the pre-emphasis circuit 11 which emphasizes the high frequencies in the signal. The pre-emphasized signal is passed to the analog adder circuit 12, where the residual quantization error from the previous encoded sample is added to it. Sample and hold circuit 20 samples and holds the result and passes it on the sample and hold circuit 13. Two sample and hold circuits are necessary to prevent the resultant sum from adder 12 from immediately effecting itself instead of the subsequent sample. The sampled and held signal is applied to the input of the standard linear analog to digital converter 15 through the non-linear circuit 14. The output of A-D converter 15 is the digitally encoded output of the system. This digital signal also is passed to the linear digital to analog circuit 18 whose output passes to the non-linear circuit 17. The functions of non-linear circuit 17 are selected to be exactly complementary to the functions of the non-linear circuit 14. The result is that the output of non-linear circuit 17 is the quantized analog representation of the input analog signal. This signal is subtracted from the input signal by the difference circuit 16 and the resultant signal added to the next analog signal value to be sampled by the adder circuit 12. Note that D-A circuit 18 may be the D-A circuit within the A-D circuit 15.

The anti-aliasing filter 19 limits the upper frequency limit of the input analog signal to one-half the sample rate of the digital encoder as is standard in digital encoding systems.

The hybrid decoder is shown in FIG. 2. The digital signal from the encoder is converted to an analog signal by the linear digital to analog converter 21 and passed through the non-linear circuit 24 which is identical to the non-linear circuit 17 of FIG. 1. It is complementary in functions to non-linear circuit 14 in FIG. 1. The output on the non-linear circuit is passed to post filter circuit 23 and then to de-emphasis circuit 22. De-emphasis circuit 22 de-emphasizes high frequency in a fashion complementary to the pre-emphasis of pre-emphasis circuit 11 in the encoder of FIG. 1. Post filter 23 is similar to antialiasing filter 19 of the encoder. It removes all frequencies beyond the upper frequency of the original analog signal passed by anti-aliasing filter 19 of FIG. 1. For best performance of the overall system, the A-D and D-A converters used in the encoder and decoder must be matched and, have high accuracy.

Figure 5:
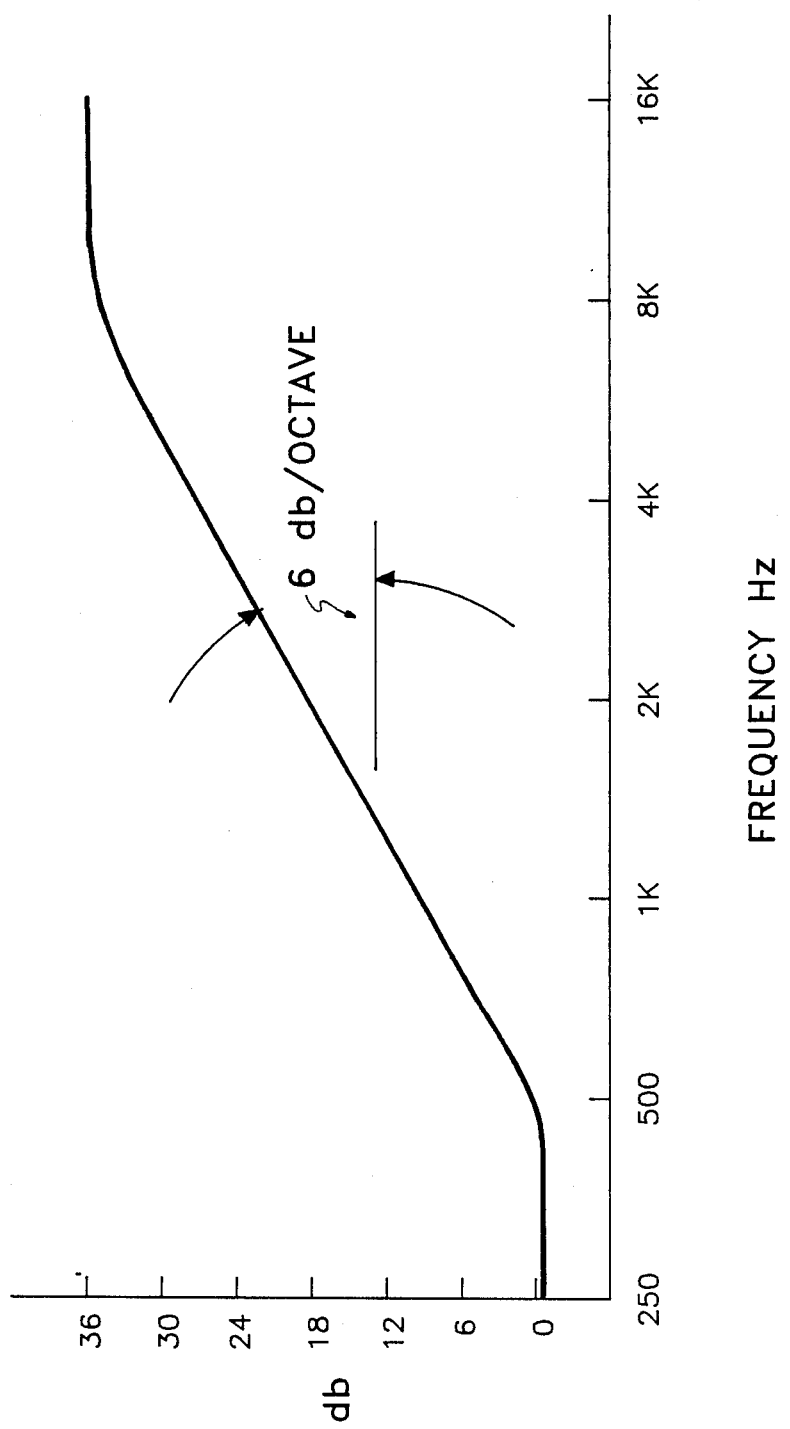
FIG. 5 is a graph showing the characteristics of a preemphasis filter as incorporated into the present invention.

Implementation of the encoder of the present invention in a full digital manner is shown in FIG. 3. The input analog signal is frequency limited by anti-aliasing filter 31. As usual, this filter restricts the upper frequency limit of the input analog signal to less than one half the sample frequency of the A-D conversion part of the system. Pre-emphasis filter 32 selectively amplifies high frequencies as was the case in the hybrid encoder of FIG. 1. For critical applications the preemphasis filters should be adaptive. That is, it should adjust the amount of pre-emphasis of high frequencies in response to the amount of high frequency signal present. The greater the amplitude of the high frequency components, the more the high frequency boost is reduced. Such adaptive pre-emphasis filters are well known in the art; the "Dolby" noise reduction type B is a typical example. If such an adaptive pre-emphasis filter is used, a complimentary filter must be used in the decoder. For less stringent applications, pre-emphasis filter 32 may be a single pole, i.e. 6 db/octave, filter designed with the slope up beginning between 200 and 1 KHz and leveling off in a shelf between 4 KHz and 10 KHz as shown in FIG. 5. A fuller explanation of the reason for this filter will follow later herein.

The output of the pre-emphasis filter passes on to the sample and hold circuit 33. Circuit 33 holds the sampled analog value while the A-D converter circuit 34 converts it to a linear digital representation. In the present invention, the A-D converter 34 is a high resolution converter. For example, converter 34 may be a 16 bit converter even though the final output digital signal of the system is 8 bits. Circuit 35 is a digital adder where the high resolution digital representation of the analog signal is added to the residue or difference between the 8 bit non-linear representation sent out as the output digital signal and the exact value of the previous sample. Circuit 36, which is designated as the non-linear encoder difference generator is, in the preferred embodiment, implemented as a dual look up table or memory. The high resolution (i.e. in the example, 16 bit) digital sum of the current sample plus the residue from the previous sample act as the address of the memory. At that "address" are two digital words. One is the closest non-linear digital representation of the sum. The other is the linear representation of the difference between that non-linear representation value and the input sum or address. The output digital signal is the non-linear digital representation and the difference is the digital signal carried back to the adder 35.

The function of circuit 36 can best be described and under stood with reference to the 8 to 4 bit encoder example shown in Table 1

TABLE 1

8 BIT DIGITAL SIGNAL ENCODED INTO A 4 BIT REPRESENTATION USING THE PRESENT INVENTION

| | |
|---|---|
| 128 | 8 |
| 64 | 7 |
| 32 | 6 |
| 16 | 5 |
| 8 | 4 |
| 4 | 3 |
| 2 | 2 |
| 1 | 1 |
| −1 | −1 |
| −2 | −2 |
| −4 | −3 |
| −8 | −4 |
| −16 | −5 |
| −32 | −6 |
| −64 | −7 |
| −128 | −8 |

Table 1 shows in column 1 some sign-magnified decimal values of an 8 bit linear representation of an analog signal ranging from +128 to −128. The next column gives the 4 bit non-linear decimal representation of these values. The encoding is simple for the values +/−1 and +/−2. They are encoded to their same value, i.e. +/−1 and +/−2. 8 bit values greater than or equal to 2 and less than 4 are also encoded to the 4 bit non-linear representation 2. The linear value 3 would be represented by the non-linear value 2 with a residue of 1. As another example, the linear 8 bit value of 23 would be represented by the nearest 4 bit non-linear representation 5, which equals 16 with a residue of 7. This encoding is a quasi-logarithmic encoding and is useful for encoding audio signals using this method because it takes advantage of the psychoacoustic phenomenon known as masking. Louder signals can mask or conceal larger errors or noise. Note that with this encoding method the encoding errors or residues tend to be proportional to the signal value.

The full digital decoder for the full digital encoder shown in FIG. 3 is shown in FIG. 4. The low resolution, non-linear digital signal is applied to a memory 41 as the address in a manner similar to that used in the encoder circuit 36. The output of the memory is a high resolution digital representation applied to the high resolution decoder 42. For instance, the encoded signal may be an 8 bit non-linear representation. The memory 41 would have 256 locations, each with a 16 bit word stored therein. That 16 bit would be the linear 16 bit representation of the 8 bit non-linear value used as its address. This 16 bit linear digital value is then converted into the analog signal by the 16 bit linear D-A converter 42. Post filter 43 then removes all signal components outside the desired signal spectrum. De-emphasis circuit 44 is complementary to the preemphasis circuit 32 in the encoder shown in FIG. 3.

The general example discussed above involved using the present invention to encode a 16 bit linear digital representation into an 8 bit form and subsequently decode it back into a 16 bit digital form and then to an analog form. The specific example of Table 1 was for an 8 bit linear representation encoded into a 4 bit form. The method of the present invention can generally be applied to encoding any higher resolution digital representation of an analog signal into a low resolution nonlinear form and recovering it. It is particularly applicable to audio signals where noise and errors proportional to signal size are more tolerable.

Table 2 illustrates the fully digital encoding and decoding implementation of the present invention as employed with the 8 bit to 4 bit example previously discussed with relation to Table 1.

TABLE 2

ILLUSTRATION OF FULL DIGITAL 8-4-8 BIT DECODER

| Row | | | | | | | |
|---|---|---|---|---|---|---|---|
| 1. | 8 bit high resolution | 16 | 9 | 34 | −8 | −1 | +23 | −72 |
| 2. | Sum of value + previous residue | 16 | 9 | 35 | −5 | −2 | +23 | −65 |
| 3. | 4 bit representation | 5 | 4 | 6 | −3 | −2 | 5 | −7 |
| 4. | Residue | 0 | 1 | 3 | −1 | 0 | 7 | −1 |
| 5. | Decoded value | 16 | 8 | 32 | −4 | −2 | 16 | −64 |
| 6. | Error | 0 | 1 | 1 | −4 | 1 | 7 | −8 |

Row 1 of Table 2 gives a series of 8 bit linear values to be encoded using the present invention. Row 2 is the sum of that value plus the residue left from the previous encoding quantization. Row 3 is the 4 bit non-linear representation of the sum. Row 4 is the residue or difference between the linear value associated with the 4 bit representation and the actual sum it is representing. Row 5 is the decoded, linear representation of the 4 bit non-linear representation. Finally, Row 6 is the resultant error. The content of the encoding and decoding memories 36 and 41 should be evident from this illustration. Various forms of non-linear encoding may be used in particular situations; but, in all instances, the digital output of 36 will be a reduced number of bits compared to its input and each of those non-linear representations will map back into specific higher resolution input values. The linear residue output 37 of the difference generator 36 is equal to the digital difference between that linear input value and the non-linear representation value decoded back to linear form.

Using this method of error or noise carry back with non-linear encoding causes highly accurate cancellation of accumulated errors at zero crossings, which results in a strong suppression of noise components at and below the principal frequency components of the encoded signal. This occurs because the quantization step size is small near zero because of the non-linear encoding. This is a very important benefit of the present invention.

Because of this, it is appropriate to pre-emphasize the higher frequencies in the original analog signal to take advantage of this suppression of lower frequency noise. For best results the pre-emphasis should be adaptive as disclosed earlier. This explains the need and form of the pre-emphasis circuits 22 of FIG. 2 and 32 of FIG. 3.

Figure 6:
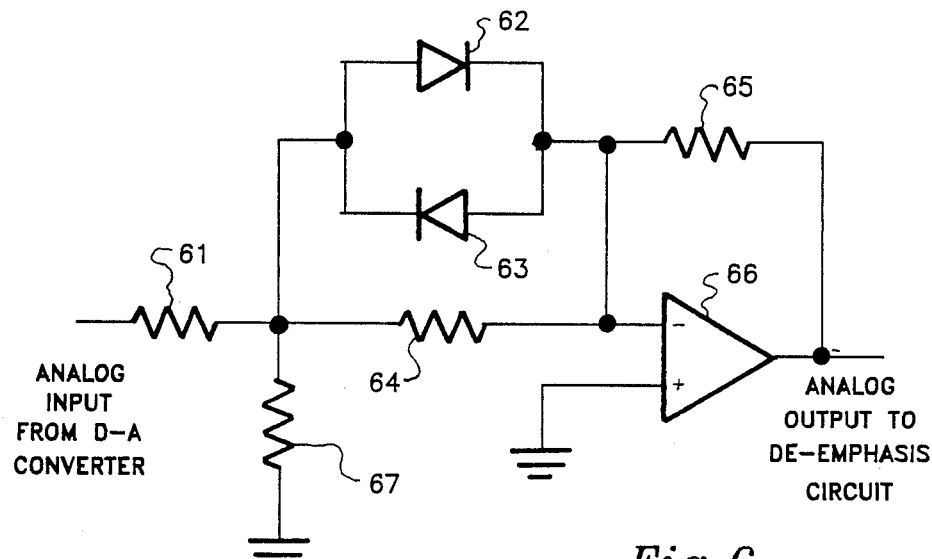
FIG. 6 is a circuit diagram of an analog non-linear decoder circuit as incorporated into the present invention.

The hybrid and fully digital forms of the present invention can be used together—often to good advantage. For instance, a fully digital implementation of the encoder may be used with a hybrid implementation of the decoder. To accomplish this, the non-linear function 24 shown in the hybrid decoder of FIG. 2 would be mapped into the digital memory 36 used in the fully digital encoder of FIG. 3. A hybrid non-linear circuit is often desirable because of its simplicity and reduced cost in the decoder. An example of a non-linear circuit usable in a decoder is shown in FIG. 6. Diodes 62 and 63 are the non-linear elements. With resistor 61 small and resistors 64 and 67 large, the system becomes essentially an exponential decoder. Note that diodes 62 and 63 are conventional semi-conductor diodes with an exponential current to voltage relationship. Resistor 61 sets the maximum slope or gain of the encoder while resistor 64 sets the minimum slope or gain. Resistor 65 sets the overall gain of the decoder circuit while 66 indicates a conventional operational amplifier. Resistor 67 acts with resistor 61 to form a voltage divider to reduce the input signal levels and impedances to the ½ volt range usable with typical diode non-linear elements.

Figure 7:
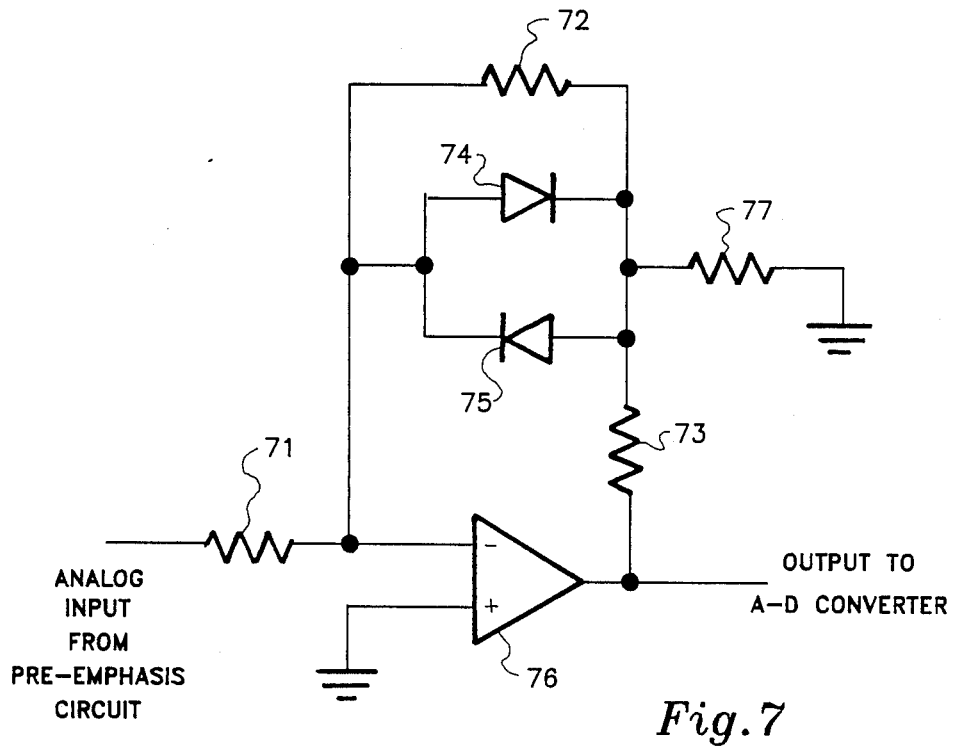
FIG. 7 is a circuit diagram of an analog non-linear encoder circuit as incorporated into the present invention.

The non-linear decoder circuit shown in FIG. 7 is complementary to the circuit of FIG. 6. Resistor 72 should equal 64, 73 should equal 61, 71 should equal 65 and 67 should equal 72. The remaining components 74-77 are also of similar designation. It should be noted that the circuit shown in FIG. 6 could be used as circuit 17 of FIG. 1.

A special case of the present invention is one in which the error residue carried back is set at zero. The benefit of reduced low frequency noise reduction is lost in this case but one gains the benefit of simplicity in the encoder. Whether or not error carryback is used in the encoder, the same decoder is usable. Thus, for those applications demanding highest performance and capable of justifying the added cost, the carryback technique may be used; but, it may be dispensed with in less critical applications and yet remain compatible with the same playback decoder.

While the pre-emphasis and de-emphasis circuits 11 and 22 of FIGS. 1 and 2 were discussed in some detail previously, they warrant further consideration. Because of the error carryback technique and non-linear encoding of the present invention, low frequency noise is substantially suppressed and shifted to higher frequencies. Therefore, the pre-emphasis of high frequencies before encoding and de-emphasis after decoding makes best use of this benefit. There is another important benefit of the present invention when considered more generally. Note that when the encoded signal is small, the accuracy of the encoded representation is higher than it is when the signal is large. If a precircuit is used which minimizes the input signal in general, the encoding will be more accurate. A simple approach to this problem is to have a pre-circuit which passes only the difference between the current sample and the previous sample. This is a differentiating or differentiator circuit. The pre-emphasis circuit described previously herein is a form of differentiator. It is modified at very high and very low frequencies to make its effect less radical.

More elaborate "predictor" circuits as known in the art can be used to great advantage as part of the present invention. A generally useful class of such predictors is one based on the derivatives of the input signal. In a simplified system, the predictor predicts what the next sample is by forming a linear combination of the derivatives of the samples up to that time. If the sample to be predicted is $T_{-0}$ and the previous sample is $T_{-1}$, and the one before that $T_{-2}$, etc., a 0th order predictor would predict that:

$$T_0 = T_{-1}$$

while a 1st order predictor would predict that:

$$T_0 = T_{-1} + T_{-1} - T_{-2} = 2T_{-1} - T_{-2}$$

thus, taking into account the rate of change of the first derivative of the signal.

A second order predictor might predict that:

$$T_0 = 3T_{-1} - 3T_{-2} = T_{-3}$$

thus, taking into account both the first and second derivatives of the signal.

Figure 8:
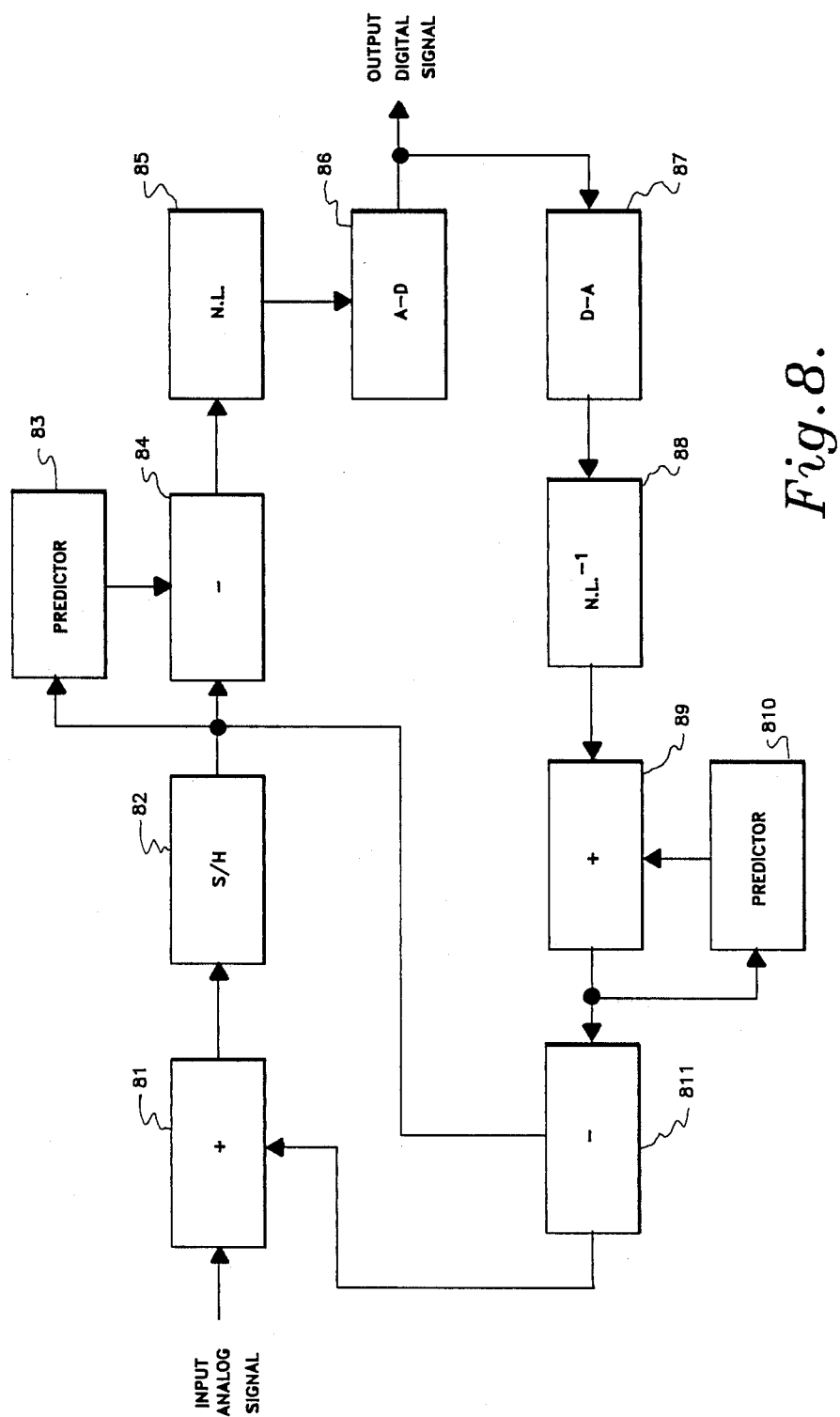
FIG. 8 is a block diagram of a hybrid encoder according to the present invention incorporating a predictor therein.

The use of a general predictor with the present invention's hybrid encoder is shown in FIG. 8. The input analog signal is added to the residue error carryback in adder circuit 81. Sample and hold circuit 82 samples and hold the current value of the analog signal. Predictor 83 outputs its prediction of the current value based on the previous sampled values as described above. Difference circuit 84 outputs the difference between the actual current value and the predictor's prediction to the non-linear circuit 85. 86 is a linear A-D converter whose output is the non-linear encoded predictor differenced digital signal. This signal is converted back into the quantized linear for of the difference signal by; D-A converter 87 and non-linear circuit 88. This difference is added to the predictor signal from predictor 810 by adder circuit 89 to output a replica of the original signal to difference circuit 811. The output of circuit 811 is the difference between this reconstructed quantized signal and the correct original signal which is carried back and added to the next sample by adder 81.

A hybrid decoder according to the present invention and employing a predictor is shown in FIG. 9. The input digital signal from the encoder is converted to analog form by linear D-A converter 91. This signal is passed through the non-linear circuit 92 to adder circuit 93 where it is added to the predictor 94 output resulting in the output analog signal. Note that predictors 83, 810 and 94 are identical in operation. These predictors must be stable; that is, not susceptible to oscillation or lockup and must converge. These requirements and how to attain them are well known to those skilled in the art and, therefore, in the interest of simplicity, will not be addressed further herein. Note that in the encoder, the function of elements 81, 83, 84, 85, 86, 87, 88, 89, 810 and 811 can all be achieved in a relatively simple fully digital processor, making the digital implementation of the present invention using a predictor much simpler than the hybrid example shown.

In the case of the fully digital encoder as shown in FIG. 10, the input analog signal is converted to a high resolution linear digital form by A-D converter 101

(which can be the A-D converter 21 of FIG. 2). The exact functions defined in Figure 8 are then all performed digitally by the digital processor 102. A standard microprocessor can be used for this function.

Similarly, in the digital implementation of the predictor decoder of FIG. 11, a digital processor 111 performs the predictor functions, summing functions, and table lookups described previously for the digital implementation of the decoder and passes on the high resolution digital representations to the linear D-A converter 112 for conversion to the sampled output analog signal.

Figure 12:
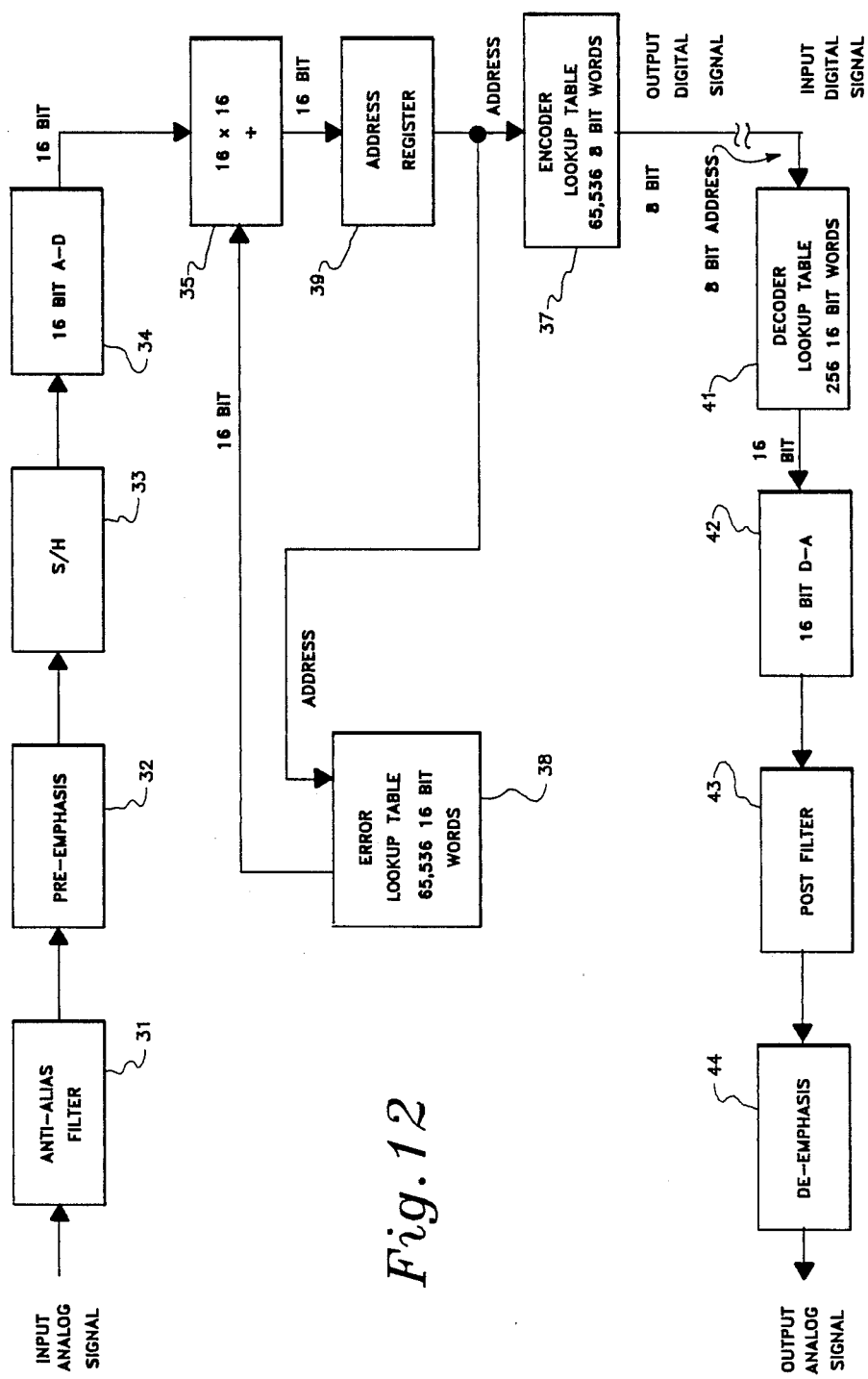
FIG. 12 is a more detailed block diagram of a digital encoder/decoder system according to the present invention.

FIG. 12 is a more detailed block diagram of the digital encoder/decoder system. Elements which are the same as in previous drawings are identified by the same reference numerals. Analog-digital encoder 34 converts the input analog samples into 16 bit digital representations. Adder 35 is a 16×16 device adapted to produce a 16 bit sum output from two 16 bit inputs. The output of adder 35 is delivered to an address register 39, which loads the word and provides a one-word delay for the signal subsequently fed back to adder 35. The address register 39 outputs a 16 bit address signal to a lookup table 37, which stores 8 bit words corresponding to each of the 65,536 possible 16 bit inputs. Lookup table 37, which may be implemented as a ROM, provides an 8 bit output which most closely approximates the 16 bit input. Since the resolution of the 16 bit words is 256 times that of the 8 bit output words, lookup table 37 provides the same 8 bit word for each set of 256 successive 16 bit input words (except for the first and last 8 bit words, which each have 128 corresponding 16 bit inputs).

The 8 bit output digital signal from lookup table 37 is transmitted to the receiver, where it is delivered as an address to the non-linear memory 41 in the form of a decoder lookup table. This lookup table stores 256 16 bit words, and converts the 8 bit input signals to 16 bit output signals for application to digital-to-analog converter 42. Decoder lookup table 41 is generally complementary to encoder lookup table 37. However, the 16 bit output from decoder lookup table 41 will generally not be exactly the same as the 16 bit input to encoder lookup table 37 because the decoder lookup table only receives 8 bit input information, and therefore has no way of knowing the precise 16 bit signal at the input to encoder lookup table 37. For each 8 bit input signal to the decoder lookup table there are 256 possible 16 bit outputs, and the memory cannot determine which one of these possible outputs corresponds to the actual 16 bit input to the encoder lookup table 37. Accordingly, the 1-6 bit output from decoder lookup table 41 is arbitrarily selected from one of the 256 possible outputs corresponding to each 8 bit input; in the preferred embodiment the 16 bit words placed in the lookup table 41 are selected to be the midpoints of each successive set of 256 16 bit words. Thus, lookup table 41 skips 255 possible words between each 16 bit word that is actually stored. In this way only one 16 bit word in the table will correspond to each of the possible 8 bit input signals.

In the process of reducing the 16 bit input to encoder lookup table 37 down to 8 bits and then expanding it back to 16 bits in decoder lookup table 41, there will thus be a difference or error between the inputs to table 37 and the outputs from table 41 (except for one in each 256 inputs). However, since for each input the outputs from the encoder and decoder lookup tables are known, the error produced for each 16 bit input to encoder lookup table 37 will also be known in advance. These error amounts are stored in an error lookup table 38 which is also addressed by the same signal that addresses encoder lookup table 37. Thus, for each 16 bit input sample, an 8 bit output signal will be produced by encoder lookup table 37, while the predicted error between the 16 bit input and the corresponding 16 bit output from decoder lookup table 41 is produced by error lookup table 38. This predicted error, the production of which is delayed by a one word interval by address register 39, is fed back to adder 35, where it is added to the next 16 bit input sample.

Figure 13:
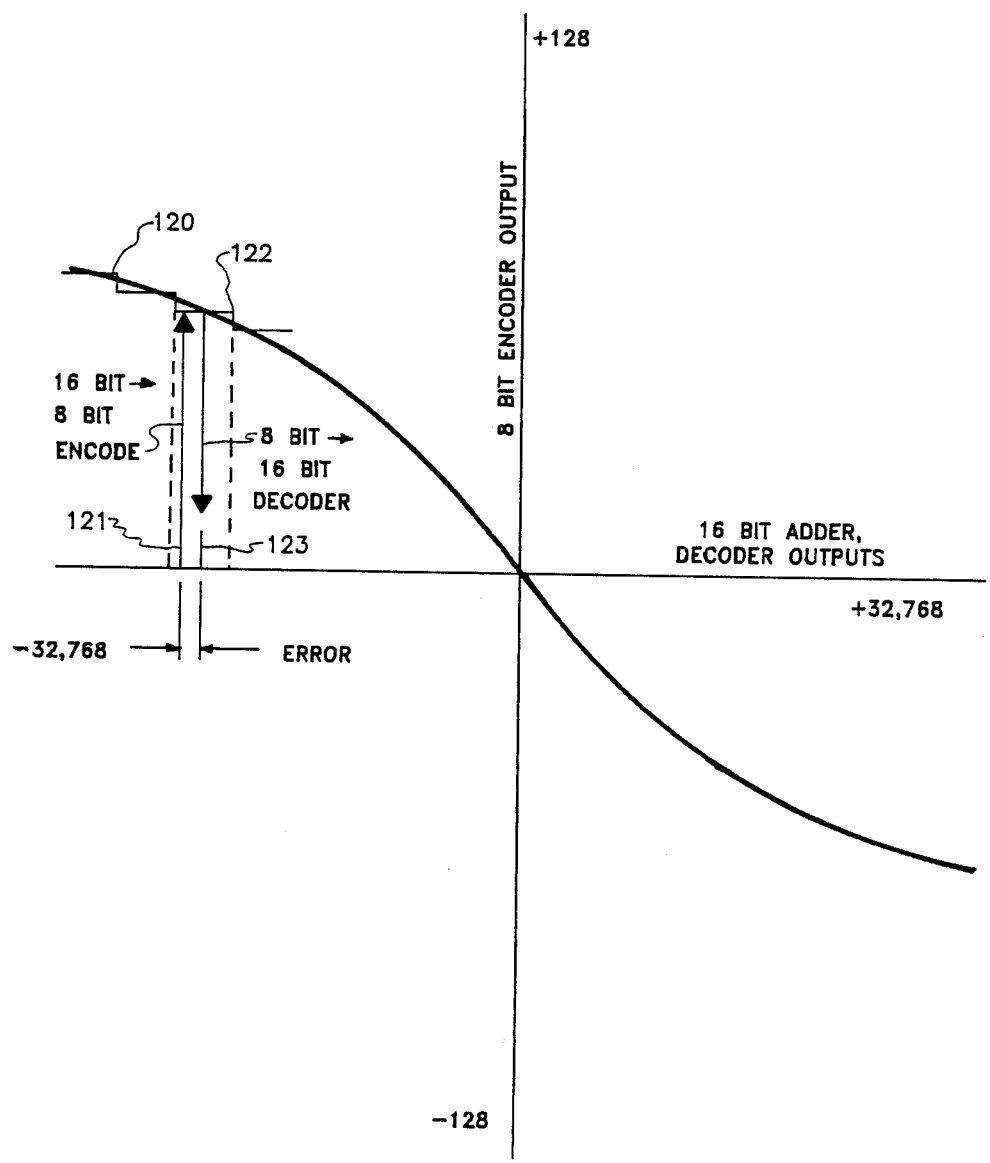
FIG. 13 is a graph illustrating the transfer functions of various elements in the system of FIG. 12.

This arrangement is illustrated graphically in FIG. 13. The 16 bit outputs of adder 35 and decoder lookup table 41 are plotted along the horizontal axis, while the 8 bit output from encoder lookup table 37 is plotted along the vertical axis. The described system encompasses a total of 65,536 different 16 bit words, and 256 different 8 bit words. Each 8 bit word corresponds to 256 successive 16 bit words, as illustrated by the exaggerated step function 120. The encoding and decoding transformations are non-linear but symmetric about the origin.

Assume first that a 16 bit input 121 addresses lookup table 37. The lookup table will produce a corresponding 8 bit encoded output signal 122. It should be noted that there are 256 different 16 bit inputs which would have produced the same 8 bit output; these 16 bit inputs are all included within the dashed lines on each side of 8 bit step 122. Since decoder lookup table 41 does not know which of the 256 different possible 16 bit inputs produced the particular 8 bit output, it arbitrarily selects the median 16 bit word 123 within this range as its output. The difference (error) between this midpoint 123 and the actual 16 bit input 121 is indicated in FIG. 13 and is delivered from error lookup table 38 to modify the next 16 bit input to adder 35.

In the preferred embodiment EPROMs are used as the memory elements. These devices are quite expensive, and collectively can represent the major cost of the system. The described transformation from 16 bits down to 8 bits, and then back again to 16 bits, halves the number of EPROMs required as compared with a full 16 bit system, and also allows the capacity of the transmission system to be halved.

While specific embodiments of the invention have been shown and described, numerous variations and alternate embodiments will occur to those skilled in the art. Accordingly, it is intended that the invention be limited only in terms of the appended claims.

I claim:

1. The method of encoding an analog signal to a digital representation thereof and then decoding the digital representation to reconstruct a duplicate of the original analog signal therefrom with low quantization noise and error, comprising the steps of:

(a) pre-emphasizing the analog signal to accentuate the high frequency components thereof;

(b) obtaining a series of high resolution digitized samples of the pre-emphasized analog signal;

(c) encoding the high resolution digitized samples to create a series of digital representations of the high resolution digitized samples having a lower order resolution than the high resolution digitized sample resolution, each of said lower order digital representations corresponding to a respective series of high resolution digitized sample values;

(d) obtaining difference measurements between said high resolution digitized samples and their corresponding lower resolution digital representations, said difference measurements being less than the number of high resolution digitized sample values in each lower order digital representation;

(e) combining each high resolution digitized sample prior to encoding with the difference measurement for the previous sample;

(f) decoding the combined encoded samples and difference measurements in a manner complementary to the sample encoding to create an approximate analog output signal; and (g) de-emphasizing the approximate analog output signal in a manner complementary to the pre-emphasis to produce an analog output signal which closely approximates the original analog signal.

2. The method of claim 1, wherein the amount of pre-emphasis and de-emphasis are adaptive with respect to the level of high frequency components of the analog signal.

3. The method of claim 1, wherein said difference measurement is provided from a look up table memory which is loaded to produce the difference measurement in response to said series to lower order digital representations.

4. The method of encoding an analog signal to a digital representation thereof for broadcast transmission, comprising the steps of:

(a) pre-emphasizing the analog signal to accentuate the high frequency components thereof;

(b) obtaining a series of high resolution digitized samples of the pre-emphasized analog signal;

(c) encoding the high resolution digitized samples to create a series of digital representations of the high resolution digitized samples having a lower order resolution than the high resolution digitized sample resolution, each of said lower order digital representations corresponding to a respective series of high resolution digitized sample values;

(d) obtaining difference between said high resolution digitized samples and their corresponding lower resolution digital representations, said difference measurements being less than the number of high resolution digitized sample values in each lower digital representation; and (e) combining each high resolution digitized sample prior to encoding with the difference measurement for the previous sample.

5. The method of claim 4, wherein the amount of pre-emphasis is adaptive with respect to the level of high frequency components of the analog signal.

6. The method of claim 6, wherein said difference measurement is provided from a lookup table memory which is loaded to lower order digital representations.

7. Encoding apparatus for encoding an analog signal to a digital representation thereof with low quantization noise and error, comprising:

(a) pre-emphasis filter circuit means having an input to which the input analog signal is applied for emphasizing high frequency components in the signal;

(b) sample and hold circuit means connected to receive the emphasized analog signal from said pre-emphasis circuit means for sampling and holding said signal to produce a series of samples;

(c) digitizing means for digitizing said samples into a high resolution digitized format;

(d) encoding means connected to encode the high resolution digitized samples to create a series of digital representations of the high resolution digitized samples having a lower order resolution than the high resolution digitized sample resolution, each of said lower order digital representations corresponding to a respective series of high resolution digitized sample values;

(e) difference generator means connected to generate as difference signal representing the difference between said high resolution digitized samples and their corresponding lower resolution digital representations, said difference measurements being less than the number of high resolution digitized sample values in each lower order digital representation; and (f) means for combining each high resolution digitized sample prior to encoding with the difference signal for the previous sample to produce an output encoded signal.

8. The apparatus of claim 7, wherein the pre-emphasis filter means is adaptive with respect to high frequency components of the input analog signal.

9. The apparatus of claim 7, the difference generator means comprising a difference memory means connected to receive the high resolution digitized samples and in response thereto generate a corresponding difference signal, and the combining means being connected to combine the difference signals with the digitized samples.

10. The apparatus of claim 9, further comprising an address register connected to the input of the encoding and difference memory means, said address register delaying the operation of said means so that the difference signal for each sample is combined with the following digitally formatted sample.

11. Digital encoding apparatus for encoding an analog signal to a low resolution non-linear digital representation thereof in a manner which reduces quantization noise and error, comprising:

(a) pre-emphasis filter circuit means having and input to which the input analog signal is applied for emphasizing high frequency components in the signal;

(b) sample and hold circuit means connected to receive the emphasized analog signal from said pre-emphasis circuit means for sampling and holding said signal to produce a series of emphasized analog sample point values;

(c) high resolution linear analog-to-digital converter means for receiving said series of analog sample point values at an input thereof and for producing a series of high resolution digital representations thereof comprising m bits at an output thereof;

(d) digital adder means having a first input connected to receive said series of high resolution digital representations and a second input for receiving a difference value, said digital adder means producing at an output thereof a series of digital values representing the sum of the input values on said first and second inputs;

(e) non-linear encoder difference generator means for receiving said series of digital values at an input thereof and for generating a series of low resolution non-linear digital values comprising n bits each at a first output thereof, where n is smaller than m and said low resolution values are the encoded high resolution digital output values of the encoder, and for generating sat a second output thereof the difference between the low resolution non-linear representation sent out as said encoded digital output values and the high resolution digital value of the previous sample; and, (f) connection means for connecting said second output of said non-linear difference generator to said second input of said digital adder means.

12. The digital encoding apparatus of claim 11, wherein the pre-emphasis filter means is adaptive with respect to high frequency components of the input analog signal.

13. The digital encoding apparatus of claim 11, wherein said pre-emphasis filter circuit means comprises:

a single pole filter having a slope up beginning between 200 and 1 KHz and leveling off in a shelf between 4 KHz and 10 KHz so as to effect a quasi-differenting function.

14. The digital encoding apparatus of claim 11, wherein: m has a value of 16 and n has a value of 8.

15. The digital encoding apparatus of claim II wherein said non-linear encoder difference generator means includes (a) a dual look up table memory wherein the high resolution digital sum of the current sample plus the difference from the previous sample represent the addresses of said memory: and wherein, (b) at each said address location of said memory are two digital words, one of said words being the closest non-linear digital representation of said associated sum, the other of said words being the linear representation of the difference between the associated said non-linear representation value and said sum.

16. Digital encoding apparatus for encoding an analog signal to a low resolution non-linear digital representation thereof in a manner which reduces quantization noise and error, comprising:

(a) pre-emphasis filter circuit means having an input to which the input analog signal is applied for emphasizing the high frequency components in the signal;

(b) sample and hold circuit means connected to receive the emphasized analog signal from said pre-emphasis circuit means for sampling and holding said signal to produce a series of emphasized analog sample point values;

(c) high resolution linear analog-to-digital converter means for receiving said series of analog sample point values at an input thereof and for producing a series of high resolution digital representations thereof comprising m bits each at an output thereof; and, (d) non-linear encoder generator means for receiving said series off high resolution digital values at an input thereof and for generating a series of low resolution non-linear digital values comprising n bits each at an output thereof, where n is smaller than m and said low resolution values are the encoded high resolution digital output values of the encoder.

17. The digital encoding apparatus of claim 16 wherein the pre-emphasis filter means is adaptive with respect to the level of the high frequency components.

18. The digital encoding apparatus of claim 17 wherein said pre-emphasis filter circuit means comprises:

a single pole filter having a slope up beginning between 200 and 1 KHz and leveling off in a shelf between 4 KHz and 10 KHz so as to effect a quasi-differencing function.

19. The digital encoding apparatus of claim 16 wherein:

m has a value of 16 and n has a value of 8.

20. The digital encoding apparatus of claim 16 wherein said non-linear generator means includes:

(a) a lookup table memory wherein the high resolution digital values of the current sample represent the addresses of said memory; and wherein, (b) at each said address location of said memory is a digital word being the closest non-linear digital representation of said associated digital value.

21. Digital decoding apparatus for encoding a series of low resolution non-linear digital representations of an analog signal to reconstruct a duplicate of the original analog signal therefrom in a manner which reduces quantization noise and error comprising:

(a) non-linear decoder generator means for receiving the series of low resolution non-linear digital representations comprising n bits each at an input thereof and for generating a series of high resolution digital values comprising m bits each at an output thereof, where n is smaller than m and said non-linear decoder generator means is complementary in functions to the non-linearity of the means by which the digital representations were originally made non-linear;

(b) high resolution linear digital to analog converter means for receiving said series of high resolution digital values at an input thereof and for producing an analog value signal at an output thereof; and (c) post filter means for receiving said analog value signal and for de-emphasizing the high frequency components thereof in a fashion complementary to any pre-emphasis placed on the original analog signal in the process of encoding it to produce a reproduction of the original analog signal at an output thereof.

22. The digital decoding apparatus of claim 21 wherein the post filter means is adaptive with respect to the level of high frequency components of the analog value signal.

23. The digital decoding apparatus of claim 21 wherein: m has a value of 16 and n has a value of 8.

24. The digital decoding apparatus of claim 21 wherein said non-linear decoder generator means includes:

(a) a lookup table memory wherein the low resolution digital representations represent the addresses of said memory; and wherein, (b) at each said address location of said memory is a high resolution digital word being the closest linear digital value for said associated digital representation.

* * * * *